(12) United States Patent
Wang et al.

(10) Patent No.: US 8,988,035 B2
(45) Date of Patent: Mar. 24, 2015

(54) SYSTEM FOR DETERMINING A MAGNETIZING CURVE AND ROTOR RESISTANCE OF AN INDUCTION MACHINE AND METHOD OF MAKING SAME

(71) Applicant: Eaton Corporation, Cleveland, OH (US)

(72) Inventors: Kai Wang, Hang Zhou (CN); Wenxi Yao, Hang Zhou (CN); Huaqiang Li, Menomonee Falls, WI (US); Zhengyu Lu, Hang Zhou (CN)

(73) Assignee: Eaton Corporation, Cleveland, OH (US)

( * ) Notice: Subject to any disclaimer, the term of this patent is extended or adjusted under 35 U.S.C. 154(b) by 154 days.

(21) Appl. No.: 13/720,668

(22) Filed: Dec. 19, 2012

(65) Prior Publication Data
US 2014/0167674 A1  Jun. 19, 2014

(51) Int. Cl.
*H02P 23/14* (2006.01)
*H05K 13/00* (2006.01)
*H02P 21/14* (2006.01)
*G01R 31/34* (2006.01)

(52) U.S. Cl.
CPC ............... *H02P 23/14* (2013.01); *H05K 13/00* (2013.01); *H02P 21/145* (2013.01); *G01R 31/34* (2013.01)
USPC ............ 318/798; 318/801; 318/802; 318/811

(58) Field of Classification Search
CPC .................................. H02P 23/14; H05K 13/00
USPC .................. 318/798, 801, 802, 811
See application file for complete search history.

(56) References Cited

U.S. PATENT DOCUMENTS

| 4,670,698 A | 6/1987 | Fulton et al. |
| 4,926,105 A | 5/1990 | Mischenko et al. |

(Continued)

FOREIGN PATENT DOCUMENTS

| DE | 4411149 A1 | 2/1995 |
| EP | 1755211 A1 | 2/2007 |

(Continued)

OTHER PUBLICATIONS

Toliyat et al., "A Review of RFO Induction Motor Parameter Estimation Techniques," IEE Transactions on Energy Conversion, vol. 18, No. 2, Jun. 2003, pp. 271-283.

(Continued)

*Primary Examiner* — David S Luo
(74) *Attorney, Agent, or Firm* — Ziolkowski Patent Solutions Group, SC

(57) ABSTRACT

A system for identifying magnetizing inductance and rotor resistance of an induction machine comprises an induction machine comprising a rotor and a stator, a DC voltage bus, and a DC-to-AC voltage inverter coupled to the DC voltage bus and to the induction machine. The system also comprises a controller configured to cause the DC-to-AC voltage inverter to apply a square-wave excitation to a plurality of phases of the induction machine, determine a stator resistance of the stator of the induction machine based on the square-wave excitation, and determine a rotor resistance of the rotor of the induction machine based on the square-wave excitation. The controller is also configured to calculate a magnetizing curve for the induction machine based on the stator and rotor resistances and control the induction machine to operate based on the magnetizing curve.

21 Claims, 3 Drawing Sheets

(56) References Cited

U.S. PATENT DOCUMENTS

| | | | |
|---|---|---|---|
| 5,334,923 | A | 8/1994 | Lorenz et al. |
| 5,796,235 | A | 8/1998 | Schrodl et al. |
| 5,994,867 | A | 11/1999 | Birk et al. |
| 5,998,958 | A * | 12/1999 | Lee .............................. 318/801 |
| 6,008,618 | A | 12/1999 | Bose et al. |
| 6,069,467 | A | 5/2000 | Jansen |
| 6,661,194 | B2 * | 12/2003 | Zaremba et al. .............. 318/727 |
| 6,774,664 | B2 * | 8/2004 | Godbersen .................... 324/545 |
| 6,940,253 | B2 | 9/2005 | Hinkkanen |
| 8,102,140 | B2 * | 1/2012 | Gao et al. ..................... 318/727 |
| 8,174,217 | B2 | 5/2012 | Zhang et al. |
| 2002/0158658 | A1 | 10/2002 | Godbersen |

FOREIGN PATENT DOCUMENTS

| | | |
|---|---|---|
| EP | 1723716 B1 | 12/2009 |
| EP | 2320559 A2 | 5/2011 |
| JP | 2003164188 A | 6/2003 |
| WO | 9219038 A1 | 10/1992 |
| WO | 2011054032 A1 | 5/2011 |

OTHER PUBLICATIONS

He et al., "Parameter Identification of an Induction Machine at Standstill Using the Vector Constructing Method," IEEE Transactions on Power Electronics, vol. 27, No. 2, Feb. 2012, pp. 905-915.

Gastli et al., "Identification of Induction Motor Equivalent Circuit Parameters Using the Single-Phase Test," IEEE Transactions on Energy Conversion, vol. 14, No. 1, Mar. 1999, pp. 51-56.

Akatsu et al., "Online Rotor Resistance Estimation Using the Transient State Under the Speed Sensorless Control of Induction Motor," IEEE Transactions on Power Electronics, vol. 15, No. 3, May 2000, pp. 553-560.

Cirrincione et al., "A Least-Squares Based Methodology for Estimating the Electrical Parameters of Induction Machine at Standstill," IEEE Int. Symp. Ind. Electron., 2002, vol. 2, pp. 541-547.

Cirrincione et al., "Experimental Verification of a Technique for the Real-time Identification of Induction Motors Based on the Recursive Least-Squares," IEEE AMC'02, Maribor, Slovenia, Jul. 3-5, 2002, pp. 326-334.

Ribeiro et al., "Real-Time Estimation of the Electric Parameters of an Induction Machine Using Sinusoidal PWM Voltage Waveforms," IEEE Transactions on Industry Applications, vol. 36, No. 3, May/Jun. 2000, pp. 743-754.

Stephan et al., "Real-Time Estimation of the Parameters and Fluxes of Induction Motors," IEEE Transactions on Industry Applications, vol. 30, No. 3, May/Jun. 1994, pp. 746-759.

Klaes et al., "Parameter Identification of an Induction Machine with Regard to Dependencies on Saturation," IEEE Transactions on Industry Applications, vol. 29, No. 6, Nov./Dec. 1993, pp. 1135-1140.

Tuovinen et al., "Modeling of Saturation Due to Main and Leakage Flux Interaction in Induction Machines," IEEE Transactions on Industry Applications, vol. 46, No. 3, May/Jun. 2010, pp. 937-945.

Donescu et al., "Modeling and Simulation of Saturated Induction Motors in Phase Quantities," IEEE Transactions on Energy Conversion, vol. 14, No. 3, Sep. 1999, pp. 386-393.

Levi et al., "A Method for Magnetizing Curve Identification in Rotor Flux Oriented Induction Machines," IEEE Transactions on Energy Conversion, vol. 15, No. 2, Jun. 2000, pp. 157-162.

Sudhoff et al., "Experimental Characterization Procedure for Use With an Advanced Induction Machine Model", IEEE Transactions on Energy Conversion, vol. 18, No. 1, Mar. 2003, pp. 48-56.

Zaky et al.", Wide-Speed-Range Estimation With Online Parameter Identification Schemes of Sensorless Induction Motor Drives," IEEE Transactions on Industrial Electronics, vol. 56, No. 5, May 2009, pp. 1699-1707.

Rasmussen et al., "Parameter Estimation of Inverter and Motor Model at Standstill using Measured Current only," IEEE Int. Symp. Ind. Electron., 1996, pp. 331-336.

Coussens et al., "Parameter Estimation for Induction Motor Field Oriented Control Using a Non-Linear Motor Model," Power Electronics and Variable-Speed Drives, Oct. 26-28, 1994, Conference Publication No. 399, pp. 198-203.

Bellini et al., "A Method for Magnetizing Curve Identification in Vector Controlled Induction Motor Drives," Speedam 2006, International Symposium on Power Electronics, Electrical Drives, Automation and Motion, pp. S1-19-S1-23.

PCT International Search Report and Written Opinion from corresponding PCT/US2013/075746, Apr. 30, 2014.

* cited by examiner

SYSTEM FOR DETERMINING A MAGNETIZING CURVE AND ROTOR RESISTANCE OF AN INDUCTION MACHINE AND METHOD OF MAKING SAME

BACKGROUND OF THE INVENTION

Embodiments of the invention relate generally to motor controls and, more particularly, to an apparatus and method determining a magnetizing curve of an induction machine.

High-performance sensorless vector control based on rotor flux orientation relies heavily on the parameter estimation of the induction machine. Many methods have been proposed for induction motor parameter identification, including online methods and the offline methods. Generally, online identifications of stator and rotor resistances are based on offline estimation values. A conventional method for rotor identification includes the locked rotor and no-load tests. However, the locked rotor and no-load tests cannot be realized in some engineering applications.

A method involving exerting different frequencies of single-phase sinusoidal excitations to the motor to imitate locked rotor and no-load situations has been proposed. A disadvantage of this method is that the frequency selection is very important, and the solution is very sensitive to sampling errors, which may result in a large rotor resistance identification error. Other methods have also been proposed based on statistical data, such as methods using a recursive least squares (RLS) algorithm. These methods can be highly precise but are often too demanding computationally, which leads to a long operation cycle.

Numerous applications use induction machines operating at a high speed far more than the rated speed. As the available voltage is limited under this high speed, the rotor flux reference are reduced as the speed increases, leading to operation in the flux weakening region. The issue of optimal magnetizing inductance updating in the flux weakening region has been a subject of great interest in recent decades. Online updating of magnetizing inductance can rely on the magnetizing curve identified offline. The magnetizing curve is typically made into a table that is stored in a controller, and the magnetizing inductance value is updated online by looking up the table according to the flux reference.

Common methods for magnetizing curve identification include curve fitting algorithms. In these methods, explicit functions are used (e.g., power functions, rational power functions, polynomials, etc.), and the coefficients of assumed functions are set accordingly. By selecting a group of magnetizing inductance estimation values under different magnetizing currents, the coefficients of the function can be solved. However, the real magnetizing curve relies on no definite function, and the magnetizing curve of one machine is different from that of another. So these methods may not be the best choice for accurate vector control.

It would therefore be desirable to have an apparatus and method for determining a magnetizing curve of an induction machine that overcome the aforementioned drawbacks.

BRIEF DESCRIPTION OF THE INVENTION

According to an aspect of the invention, a system for identifying magnetizing inductance of an induction machine comprises an induction machine comprising a rotor and a stator, a DC voltage bus, and a DC-to-AC voltage inverter coupled to the DC voltage bus and to the induction machine. The system also comprises a controller configured to cause the DC-to-AC voltage inverter to apply a square-wave excitation to a plurality of phases of the induction machine, determine a stator resistance of the stator of the induction machine based on the square-wave excitation, and determine a rotor resistance of the rotor of the induction machine based on the square-wave excitation. The controller is also configured to calculate a magnetizing curve for the induction machine based on the stator and rotor resistances and control the induction machine to operate based on the magnetizing curve.

According to another aspect of the invention, system for determining induction machine magnetizing inductance comprises a DC-to-AC voltage inverter coupled to a DC voltage bus and to an induction machine. The system also includes a controller configured to cause the DC-to-AC voltage inverter to apply a square-wave excitation to a pair of phases of the induction machine and determine a stator resistance, $R_s$, of the induction machine based on the square-wave excitation. The controller is also configured to determine a rotor resistance, $R_r$, of the induction machine based on the square-wave excitation, to calculate a magnetizing curve based on the stator resistance, $R_s$ and based on the rotor resistance, $R_r$, and to control the induction machine to operate according to the magnetizing curve.

According to yet another aspect of the invention, a method of manufacturing an induction machine control circuit comprises providing an induction machine, coupling a DC-to-AC voltage inverter to the induction machine, and coupling a DC voltage bus to the DC-to-AC voltage inverter. The method also includes configuring a controller to cause the DC-to-AC voltage inverter to apply a square-wave excitation to a pair of phases of the induction machine, to determine a stator resistance of a stator of the induction machine based on the square-wave excitation, and to determine a rotor resistance, $R_r$, of the induction machine based on the square-wave excitation. The controller is also configured to calculate a magnetizing curve for the induction machine based on the stator resistance and rotor resistance and to control the induction machine to operate based on the magnetizing curve.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Figure 1:
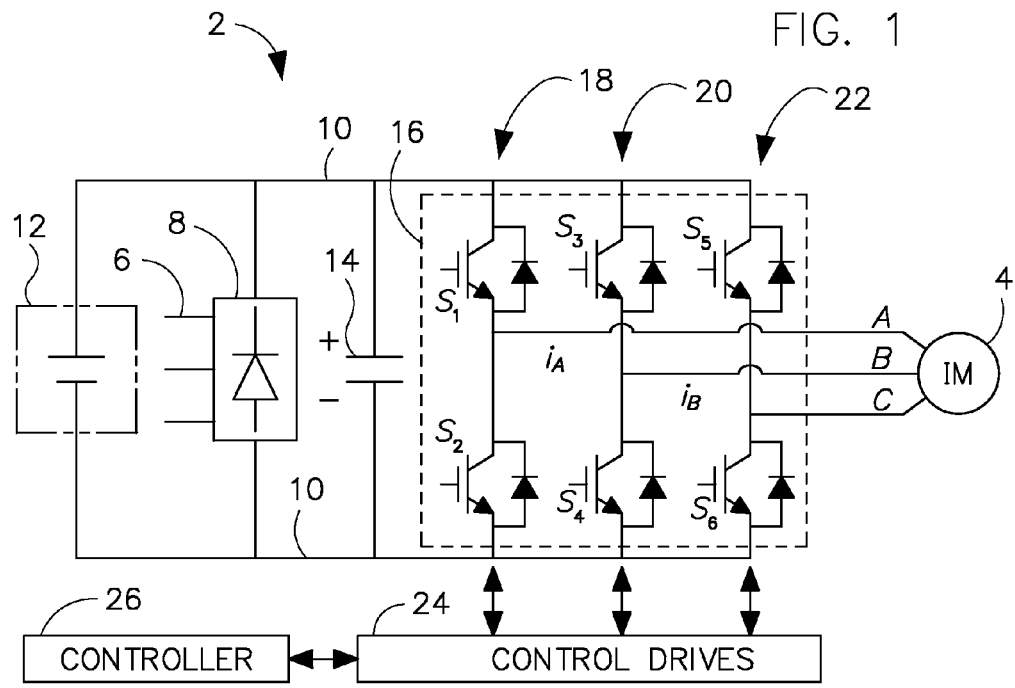
FIG. 1 is a circuit diagram of a control circuit for an induction machine according to an embodiment of the invention.

FIG. 1 is a circuit diagram of a control circuit 2 for an induction machine 4 according to an embodiment of the invention. In one embodiment, control circuit 2 includes an input 6 configured to receive AC power from and AC source such as an electrical grid. A rectifier assembly 8 is coupled to input 6 to convert the AC power to DC power and to supply the DC power to a DC bus 10. In an alternative embodiment, the DC power supplied to the DC bus 10 may be supplied by a DC energy source 12 (shown in phantom) such as a high-energy battery or the like. A filter capacitor 14 coupled to DC bus 10 may be used to provide a smoothing function for DC bus 10 and to filter high-frequency currents on DC bus 10.

A voltage inverter 16 is coupled to DC bus 10 and to induction machine 4. Preferably, voltage inverter 16 is a bi-directional voltage modification assembly configured to invert DC energy on DC bus 10 to AC energy usable by induction machine 4. Voltage inverter 16 includes six switches $S_1$-$S_6$ that are paired to form three phases 18 ($S_1$-$S_2$), 20 ($S_3$-$S_4$), 22 ($S_5$-$S_6$). Each phase 18, 20, 22 is coupled to DC bus 10 and to a respective phase (A, B, C) of induction machine 4.

A control drive assembly 24 is coupled to voltage inverter 16 to control switches $S_1$-$S_6$ to invert DC energy from DC bus 10 to AC energy for supply to induction machine 4. In addition, when operated as a generator (such as in a regenerative braking mode, for example), induction machine 4 may supply AC energy to voltage inverter 16 for inversion to DC energy for supply to DC bus 10. A controller 26 is coupled to control drive assembly 24 and may be used to activate control drive assembly 24 such that switches $S_1$-$S_6$ may be operated according to embodiments of the invention.

Figure 2:
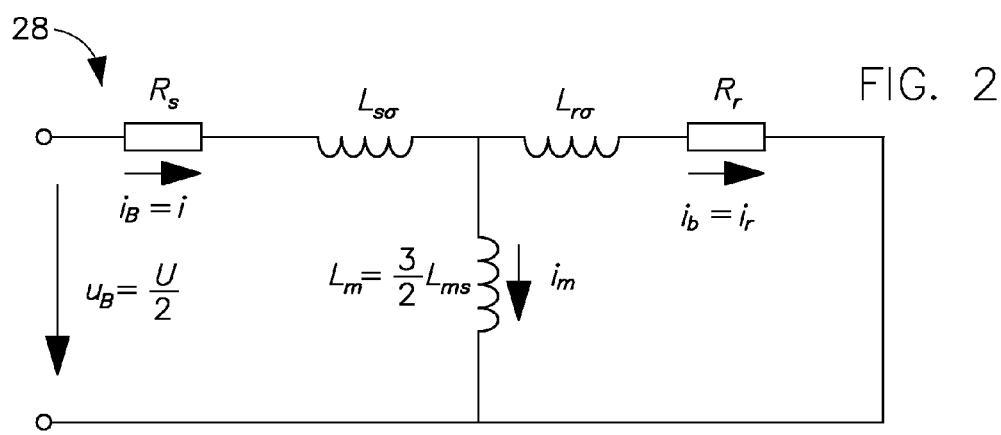
FIG. 2 is a circuit diagram of an equivalent T-type circuit of an induction machine phase according to an embodiment of the invention.

According to embodiments of the invention, a magnetizing curve for induction machine 4 is determined experimentally. Two phases (such as phases A and B) of induction machine 4 are used to determine the magnetizing curve. As such, phases 18, 20 of voltage inverter 16 are also used. To determine the magnetizing curve, an equivalent circuit based on a dynamic physical model of one of the induction machine phases may be used to determine machine parameters. FIG. 2 illustrates an equivalent circuit 28 of an induction machine phase according to an embodiment of the invention. As will be explained below, a square-wave excitation is exerted between arbitrary two phases (e.g., A and B) of the stator and the useful information for identification can be extracted from the stator current response curve. Under square-wave excitation exerted between arbitrary two phases of the stator, the circuit model is equivalent to a series of two T-type steady state equivalent circuits. Circuit 28 illustrates one of the two T-type equivalent circuits (such as a T-type circuit of phase B) of induction machine 4. However, the parameters determined for phase B of induction machine 4 are also used as the parameters for phase A or phase C of induction machine 4 also.

In circuit 28, resistor $R_s$ and $L_{s\sigma}$ respectively represent the resistance and leakage inductance of the stator of induction machine 4. Resistor $R_r$ and $L_{r\sigma}$ respectively represent the resistance and leakage inductance of the rotor of induction machine 4. Parameter $L_m$ represents the magnetizing inductance of induction machine 4 and is the parameter for which a magnetizing curve is determined by embodiments of the invention.

Figure 3:
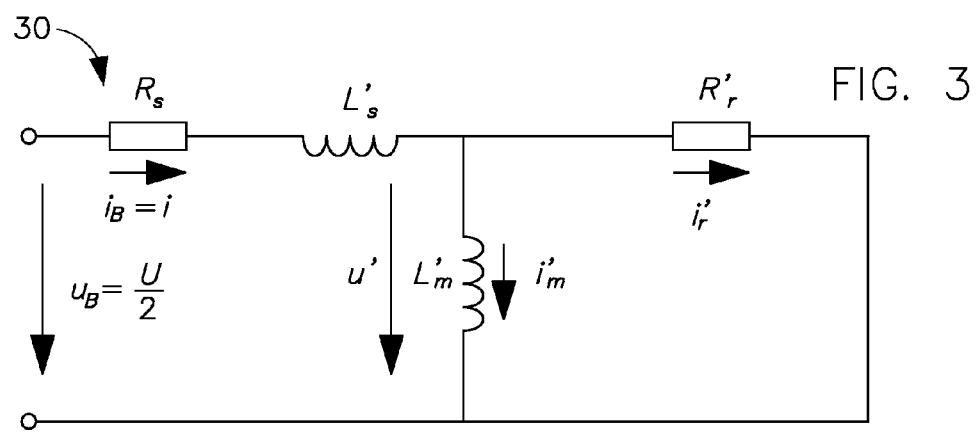
FIG. 3 is a circuit diagram of an equivalent F-type circuit of an induction machine phase according to another embodiment of the invention.

If desired, the T-type equivalent circuit shown in FIG. 2 can be converted to an anti F-type equivalent circuit 30 as shown in FIG. 3. Under normal circumstances, the stator and rotor leakage inductance are considered to be equal with each other. Accordingly, in embodiments of the invention described herein, the leakage inductances of the stator and rotor are denoted by $L_{s\sigma} L_{r\sigma} = L_\sigma$. The parameter relationships between the T-type equivalent circuit of FIG. 2 and the anti F-type equivalent circuit of FIG. 3 are as follows:

$$L'_s = \sigma(L_m + L_\sigma), \qquad \text{(Eqn. 1)}$$

$$L'_m = \frac{L_m^2}{L_m + L_\sigma}, \qquad \text{(Eqn. 2)}$$

$$R'_r = \frac{L_m^2}{(L_m + L_\sigma)^2} R_r. \qquad \text{(Eqn. 3)}$$

Figure 4:
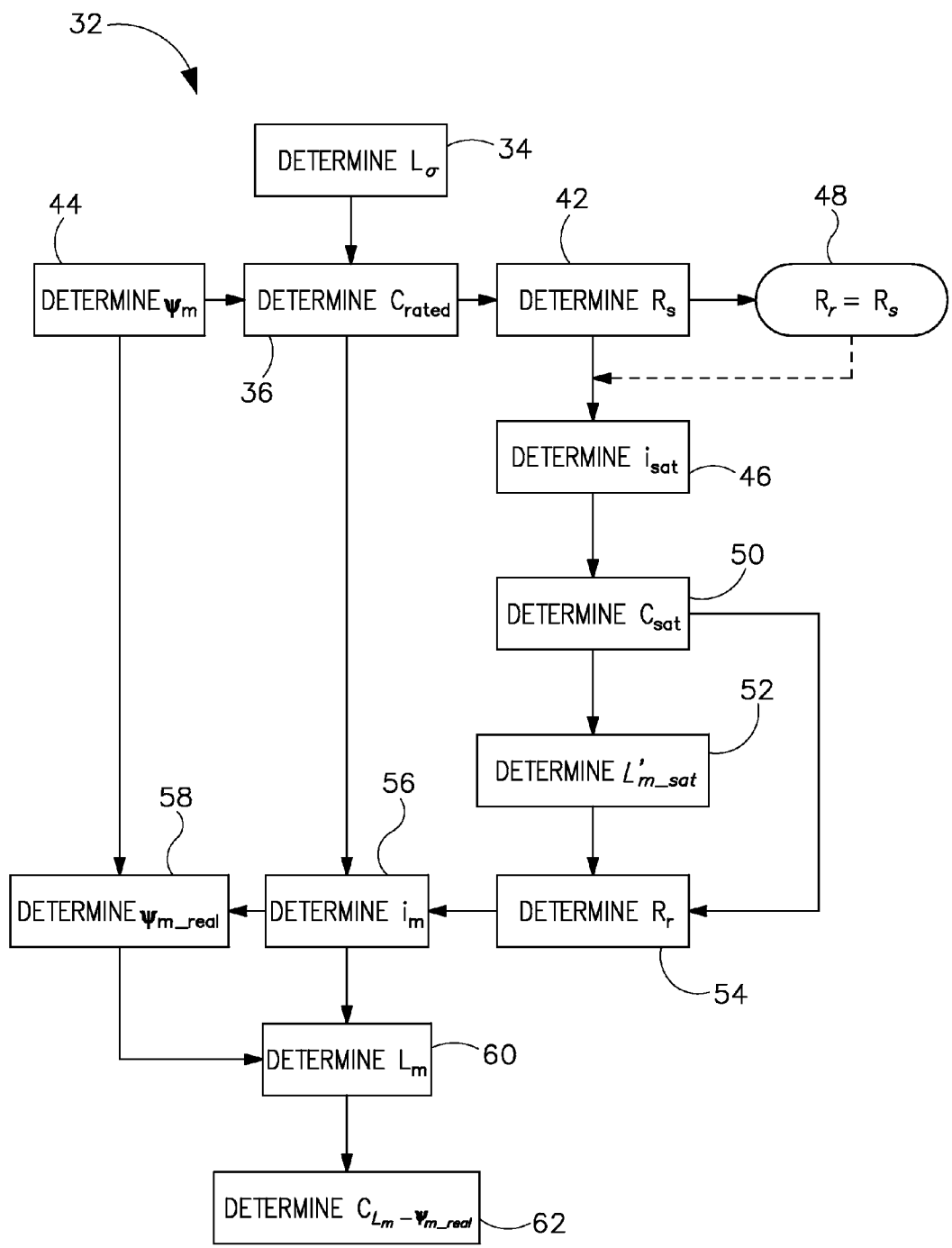
FIG. 4 is a flowchart illustrating a technique for determining a magnetizing curve of an induction machine according to an embodiment of the invention.

FIG. 4 is a flowchart illustrating a technique 32 for determining a magnetizing curve of an induction machine according to an embodiment of the invention. At step 34, the leakage inductance value $L_\sigma$ is determined or identified through a method known in the art such as, for example, exerting an appropriate high frequency pulse. Other known methods, however, may also be used. In general, the leakage inductance is considered to be free of temperature, speed and saturation effects, so leakage inductance values are assumed to remain constant all the time.

Figure 5:
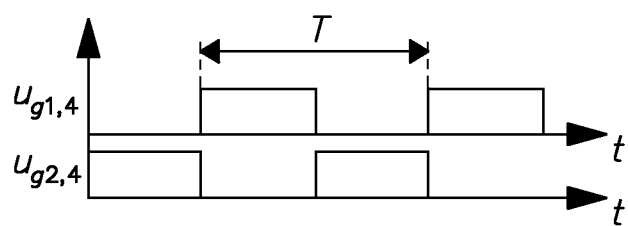
FIG. 5 is a pulse diagram of a square-wave pulse sequence implemented by embodiments of the invention.
Figure 6:
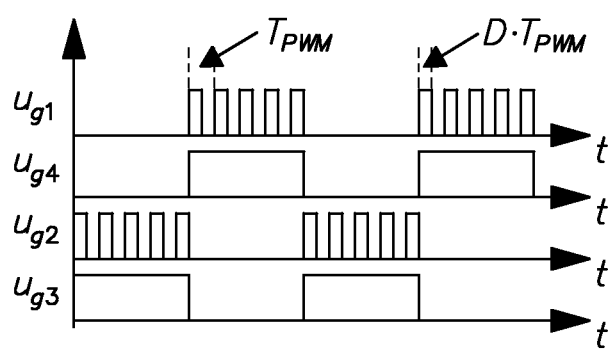
FIG. 6 is a pulse diagram of a square-wave pulse sequence implemented by embodiments of the invention.

At step 36, the rated stator current response curve $C_{rated}$ is obtained. A square-wave excitation is exerted between arbitrary two phases (e.g. A and B) of the stator as mentioned above. Referring as well to FIGS. 5 and 6, square-wave pulse sequences 38, 40 are illustrated based on a control of switches $S_1$-$S_4$ so as to produce the square-wave pulses to phases A and B of induction machine 4 from a DC voltage with constant magnitude applied on the inverter DC bus 10. The DC voltage can be obtained either by a linear DC source (DC energy source 12) or rectifier assembly 8 as shown in FIG. 1. If the DC voltage is obtained by the linear DC source with a magnitude of $U_{DC}$, the square-wave excitation can be realized through complementary PWM drive signals on the switch pairs $S_{1,4}$ and $S_{2,3}$ of inverter 16 as shown in FIG. 5, and the amplitude of the square-wave excitation is also $U_{DC}$. However, if the DC voltage is obtained by the three-phase rectifier 8, a high-frequency chopper is used to reduce the high voltage $U_{DC\_bus}$ on the DC bus 10, and the PWM drive signals on switches $S_1$-$S_4$ of inverter 16 are shown in FIG. 6. Thus, final amplitude of the square-wave excitation is $U_{DC} = U_{DC\_bus} \cdot D$.

In accordance with the rated current value $i_{rated}$ indicated on the motor nameplate, a square-wave excitation with an appropriate amplitude and period are exerted, making sure the stator current reaches steady state at the rated value $i_{rated}$ before the square-wave changes levels. For this purpose, as illustrated in FIGS. 5 and 6, switches $S_1$, $S_4$ are controlled to their on states, and switches $S_2$, $S_3$ are controlled to their off states. Thus, the "square wave" becomes a constant DC excitation, and a current loop with PI control can be employed to ensure that the steady stator current reaches the rated value $i_{rated}$. Then, switches $S_1$, $S_4$ and $S_2$, $S_3$ are alternately controlled to conduct in complementary states as shown in FIGS. 5 and 6, and the period T of the PWM drive signals is adjusted to ensure the stator current reaches steady state before the square-wave again changes levels. Several groups of the stator current i are measured during one half cycle, and an average is determined to obtain the rated stator current response curve named $C_{rated}$.

Referring back to FIG. 4, the magnitude $U_{DC}$ of the DC voltage is recorded by a voltage sensor (not shown). Then, the voltage drop on inverter switches, $V_{inverter}$, is subtracted from the magnitude $U_{DC}$, and $U = U_{DC} - V_{inverter}$ is obtained, which is the real square-wave amplitude exerted directly on the motor. Consequently, the stator resistance can be identified by $$R_s = \frac{U}{2i_{rated}}$$

at step 42.

At step 44, the magnetizing flux identification, $\psi_m$, is determined. As $R_s$ and $L_o$ are known, the single phase magnetizing flux $\psi_m$ can be derived through the stator current response curve $C_{rated}$ according to the following equation:

$$\psi_m(k) = \psi_m(k-1) + \left[\frac{U}{2} - R_s i(k)\right] T_s - L_\sigma T_s [i(k) - i(k-1)]. \quad \text{(Eqn. 4)}$$

where $T_s$ denotes the sampling period and where $\psi_m(0)=0$, $i(0)=-i_{rated}$, $k \le T/2T_s$ and T denotes the period of the square-wave excitation.

At step 46, the saturation current $i_{sat}$ (or also knows as the critical saturation current) is determined. The instantaneous inductance can be expressed as:

$$L'_m = \frac{U/2 - R_s i - 2L_\sigma \frac{di}{dt}}{\left[(R_s + R'_r)\frac{di}{dt} + 2L_\sigma \frac{d^2 i}{dt^2}\right]/R'_r}. \quad \text{(Eqn. 5)}$$

Because $L_o \approx 0$, the $$2L_\sigma \frac{d^2 i}{dt^2}$$

can be canceled, thus:

$$L'_m = \left(\frac{U/2 - R_s i}{\frac{di}{dt}} - 2L_\sigma\right) \frac{R'_r}{R_s + R'_r}, \quad \text{(Eqn. 6)}$$

which means that the instantaneous inductance has a linear relation with the equivalent rotor resistance $R'_r$. In other words, the equivalent rotor resistance $R'_r$ affects the value of instantaneous inductance, but does not affect the saturation point of the magnetizing curve. Assuming at step 48 that $R_r$ equals $R_s$, the instantaneous magnetizing inductance $L'_m$ can be obtained under the stator current response curve $C_{rated}$. Then, the corresponding instantaneous magnetizing inductance curve is drawn, from which the saturation point of the magnetizing inductance can be determined. In one embodiment, a corresponding sampling point can be recognized as the saturation point when the magnetizing inductance value descends to 90% of its maximum value. The stator current value at the saturation point is recorded, and the corresponding magnetizing current $i_m$ can be obtained by the equation:

$$i_m = i - \frac{U/2 - R_s i - 2L_\sigma \frac{di}{dt}}{R_s}. \quad \text{(Eqn. 7)}$$

Thus, the critical saturation current $i_{sat}$ is the magnetizing current determined by Eqn. 7. It should be noted that this critical saturation current $i_{sat}$ is derived by assumption, so there is some error associated with it. In an actual experiment, the critical saturation current $i_{sat}$ can be chosen as small as possible depending on the sampling accuracy.

At step 50, the unsaturated stator current response curve $C_{sat}$ is determined. Following with step 36, a current loop control can be employed to adjust the square-wave excitation amplitude, making sure the steady state stator current equals $i_{sat}$. Then, several groups of the stator current i during one half cycle are measured, and an average is taken to obtain the unsaturated stator current response curve $C_{sat}$.

At step 52, the unsaturated magnetizing inductance $L'_{m\_sat}$ is identified or determined. Through $C_{sat}$, the unsaturated magnetizing inductance $L'_{m\_sat}$ can be obtained by the equation:

$$L'_{m\_sat} = \frac{T_s}{2i_{sat}} \sum_{0}^{k=N} (U/2 - R_s i(kT_s)) - 2L_\sigma \quad \text{(Eqn. 8)}$$

in which, $$N = \frac{T}{2T_s}$$

and T denotes the period of the square-wave excitation.

At step 54, the rotor resistance $R_r$ is determined. As $L'_{m\_sat}$ is known, a group of rotor resistance values can be obtained through $C_{sat}$ and the following equations:

$$R'_r = \frac{\left(R_s \frac{di}{dt} + 2L_\sigma \frac{d^2 i}{dt^2}\right)}{\frac{U/2 - R_s i - (2L_\sigma + L'_{m\_sat})\frac{di}{dt}}{L'_{m\_sat}}} \quad \text{(Eqn. 9)}$$

$$L_{m\_sat} = \frac{L'_{m\_sat} + \sqrt{L'^2_{m\_sat} + 4L_\sigma}}{2} \quad \text{(Eqn. 10)}$$

$$R_r = \frac{(L_{m\_sat} + L_\sigma)^2}{L^2_{m\_sat}} R'_r \quad \text{(Eqn. 11)}$$

in which the differential and second differential current values at each sampling point are defined by equations:

$$\frac{di}{dt} = pi(k) = \frac{i[(k+1)T_s] - i(kT_s)}{T_s} \quad \text{(Eqn. 12)}$$

$$\frac{d^2 i}{dt^2} = p^2 i(k) = \frac{pi[(k+1)T_s] - pi(kT_s)}{T_s} \quad \text{(Eqn. 13)}$$

Taking an average of all the estimation values to eliminate random errors, the real value of $R_r$ in the T-type equivalent circuit can be derived.

At step 56, the real magnetizing current curve $i_m$ is calculated. As $R_r$ is known, the real magnetizing current curve of $i_m$ can be obtained through $C_{rated}$ and $$i_m = i - \frac{U/2 - R_s i - 2L_\sigma \frac{di}{dt}}{R_r}. \qquad \text{(Eqn. 14)}$$

At step 58, of the real single phase magnetizing flux $\psi_{m\_real}$ is calculated or determined. The zero-crossing point of the real magnetizing current curve of $i_m$ and the corresponding single phase magnetizing flux value of $\psi_m$ is found, named $\psi_{m\_offset}$. Further, the real single phase magnetizing flux can be obtained by the equation:

$$\psi_{m\_real} = \psi_m - \psi_{m\_offset}. \qquad \text{(Eqn. 15)}$$

At step 60, magnetizing inductance $L_m$ is calculated at different times by $L_m = \psi_{m\_real}/i_m$, and the magnetizing curve $$C_{L_m - \psi_{m\_real}}$$

is plotted at step 62. In one embodiment, the magnetizing curve is formed by calculating each point thereof based on the magnetizing inductance $L_m$. In this manner, the magnetizing curve represents actual values captured along its length instead of having a plurality of interpolated points based on a curve fit approach. If the actual single-phase flux reference is $\psi_{m\_ref}$ in the rotor flux orientation control, the corresponding magnetizing flux value $\psi_{m\_real}$ under the square-wave excitation is $$\frac{\sqrt{3}}{2} \psi_{m\_ref}.$$

Substituting $$\psi_{m\_real} = \frac{\sqrt{3}}{2} \psi_{m\_ref}$$

into $$C_{L_m - \psi_{m\_real}}$$

the magnetizing curve can be updated to $$C_{L_m - \psi_{m\_ref}}$$

As each induction machine is unique, the calculation of a revised magnetizing curve based on one machine may not be an optimal revised curve for all machines of the same type. As such, embodiments of the invention allow for capturing how inductance flux changes for an individual machine and takes advantage of the ability to capture how the inductance flux changes with speed for that machine. Accordingly, the individualized revised magnetizing curve for a particular machine allows for optimizing control of that machine when operated above rated speeds. Controller 26 and/or control drive assembly 24 of FIG. 1 may be programmed to experimentally determine the magnetizing curve as described in embodiments herein. That is, controller 26 and/or control drive assembly 24 may be programmed to carry out technique 32 to determine the magnetizing curve. In addition, controller 26 and/or control drive assembly 24 may be programmed to operate control circuit 2 such that induction machine 4 is controlled according to the updated magnetizing curve.

Therefore, according to an embodiment of the invention, a system for identifying magnetizing inductance of an induction machine comprises an induction machine comprising a rotor and a stator, a DC voltage bus, and a DC-to-AC voltage inverter coupled to the DC voltage bus and to the induction machine. The system also comprises a controller configured to cause the DC-to-AC voltage inverter to apply a square-wave excitation to a plurality of phases of the induction machine, determine a stator resistance of the stator of the induction machine based on the square-wave excitation, and determine a rotor resistance of the rotor of the induction machine based on the square-wave excitation. The controller is also configured to calculate a magnetizing curve for the induction machine based on the stator and rotor resistances and control the induction machine to operate based on the magnetizing curve.

According to another embodiment of the invention, system for determining induction machine magnetizing inductance comprises a DC-to-AC voltage inverter coupled to a DC voltage bus and to an induction machine. The system also includes a controller configured to cause the DC-to-AC voltage inverter to apply a square-wave excitation to a pair of phases of the induction machine and determine a stator resistance, $R_s$, of the induction machine based on the square-wave excitation. The controller is also configured to determine a rotor resistance, $R_r$, of the induction machine based on the square-wave excitation, to calculate a magnetizing curve based on the stator resistance, $R_s$ and based on the rotor resistance, $R_r$, and to control the induction machine to operate according to the magnetizing curve.

According to yet another embodiment of the invention, a method of manufacturing an induction machine control circuit comprises providing an induction machine, coupling a DC-to-AC voltage inverter to the induction machine, and coupling a DC voltage bus to the DC-to-AC voltage inverter. The method also includes configuring a controller to cause the DC-to-AC voltage inverter to apply a square-wave excitation to a pair of phases of the induction machine, to determine a stator resistance of a stator of the induction machine based on the square-wave excitation, and to determine a rotor resistance, $R_r$, of the induction machine based on the square-wave excitation. The controller is also configured to calculate a magnetizing curve for the induction machine based on the stator resistance and rotor resistance and to control the induction machine to operate based on the magnetizing curve.

Embodiments of the present invention have been described in terms of the preferred embodiment, and it is recognized that equivalents, alternatives, and modifications, aside from those expressly stated, are possible and within the scope of the appending claims.

What is claimed is:

1. A system for identifying magnetizing inductance of an induction machine, the system comprising:
    an induction machine comprising a rotor and a stator;
    a DC voltage bus;
    a DC-to-AC voltage inverter coupled to the DC voltage bus and to the induction machine; and
    a controller configured to:
        cause the DC-to-AC voltage inverter to apply a square-wave excitation to a plurality of phases of the induction machine;
        determine a stator resistance of the stator of the induction machine based on the square-wave excitation;

determine a rotor resistance of the rotor of the induction machine based on the square-wave excitation;

calculate a magnetizing curve for the induction machine based on the stator and rotor resistances; and control the induction machine to operate based on the magnetizing curve.

2. The system of claim 1 wherein the DC-to-AC voltage inverter comprises:

a first pair of switches coupled to a first phase of the plurality of phases of the induction machine; and a second pair of switches coupled to a second phase of the plurality of phases of the induction machine; and wherein the controller, in being configured to cause the DC-to-AC voltage inverter to apply the square-wave excitation, is configured to:

control a first switch of the first pair of switches to an on state;

control a second switch of the first pair of switches to an off state;

control a first switch of the second pair of switches to an on state; and control a second switch of the second pair of switches to an off state.

3. The system of claim 2 wherein the controller, in being configured to cause the DC-to-AC voltage inverter to apply the square-wave excitation, is configured to cause the DC-to-AC voltage inverter to:

apply one pulse of the square-wave excitation for a time sufficient to allow a steady stator current to reach a rated current value of the induction machine;

measure a plurality of stator current values after the steady stator current has reached the rated current value; and calculate a rated stator current response curve based on an average of the plurality of stator current values.

4. The system of claim 3 wherein the controller is further configured to:

calculate an instantaneous magnetizing inductance curve based on the rated stator current response curve;

determine a saturation point on the instantaneous magnetizing inductance curve; and determine a critical saturation current value of the induction machine based on the saturation point and based on the stator resistance being equal to the rotor resistance.

5. The system of claim 4 wherein the controller is further configured to:

determine a critical saturation current of the induction machine;

cause the DC-to-AC voltage inverter to apply one pulse of the square-wave excitation for a time sufficient to allow a steady stator current to reach the critical saturation current;

measure a plurality of stator saturation current values after the steady stator current has reached the critical saturation current; and calculate an unsaturated stator current response curve based on an average of the plurality of stator saturation current values.

6. The system of claim 5 wherein the controller is further configured to:

determine an unsaturated magnetizing inductance of the induction machine based on the unsaturated stator current response curve; and determine a rotor resistance of the rotor of the induction machine based on the unsaturated stator current response curve and based on the unsaturated magnetizing inductance.

7. The system of claim 6 wherein the controller is further configured to determine a real magnetizing current curve based on the rotor resistance and based on the rated stator current response curve.

8. The system of claim 7 wherein the controller is further configured to determine a single phase magnetizing flux based on a zero-crossing point of the real magnetizing current curve and a corresponding single phase magnetizing flux value.

9. The system of claim 8 wherein the controller is further configured to determine a magnetizing inductance of the induction machine based on the single phase magnetizing flux and based on the real magnetizing current curve.

10. The system of claim 9 wherein the controller, in being configured to calculate the magnetizing curve, is configured to:

calculate a magnetizing inductance based on the single phase magnetizing flux and based on the real magnetizing current curve; and calculate the magnetizing curve based on the magnetizing inductance.

11. The system of claim 2 wherein the controller, in being configured to cause the DC-to-AC voltage inverter to apply the square-wave excitation, is configured to:

control the first switch of the first pair of switches to an off state;

control the second switch of the first pair of switches to an on state;

control the first switch of the second pair of switches to an off state; and control the second switch of the second pair of switches to an on state.

12. A system for determining induction machine magnetizing inductance comprising:

a DC-to-AC voltage inverter coupled to a DC voltage bus and to an induction machine; and a controller configured to:

cause the DC-to-AC voltage inverter to apply a square-wave excitation to a pair of phases of the induction machine;

determine a stator resistance, $R_s$, of the induction machine based on the square-wave excitation;

determine a rotor resistance, $R_r$, of the induction machine based on the square-wave excitation;

calculate a magnetizing curve, $C_{L_m,\psi_{m\_real}}$, based on the stator resistance, $R_s$, and based on the rotor resistance, $R_r$; and control the induction machine to operate according to the magnetizing curve, $C_{L_m,\psi_{m\_real}}$.

13. The system of claim 12 wherein the controller is further configured to:

measure a plurality of stator current values during one half cycle of the square-wave excitation and during a steady stator current of a rated current value, $i_{rated}$, of the induction machine flowing through a stator of the induction machine; and calculate a rated stator current response curve, $C_{rated}$, based on an average of the plurality of stator current values.

14. The system of claim 13 wherein the controller is further configured to:

derive a single phase magnetizing flux, $\psi_m$, based on the stator current response curve, $C_{rated}$, based on the following equation:

$$\psi_m(k) = \psi_m(k-1) + \left[\frac{U}{2} - R_s i(k)\right]T_s - L_\sigma T_s[i(k) - i(k-1)]$$

where $T_s$ denotes a sampling period and where $\psi_m(0)=0$, $I(0)=-i_{rated}$, $k \leq T/2T_s$, T denotes the period of the square-wave excitation, and U denotes an amplitude of the square-wave excitation exerted on the induction machine.

15. The system of claim 14 wherein the controller is further configured to:

calculate a real single phase magnetizing flux, $\psi_{m\_real}$, based on the following equation:

$$\psi_{m\_real} = \psi_m - \psi_{m\_offset},$$

where $\psi_{m\_offset}$ is a zero-crossing point of a real magnetizing current curve, $i_m$, and the corresponding single phase magnetizing flux value of $\psi_m$.

16. The system of claim 15 wherein the controller is further configured to determine a magnetizing inductance, $L_m$, of the induction machine based on the equation:

$$L_m = \psi_{m\_real}/i_m.$$

17. The system of claim 15 wherein the controller is further configured to determine the a real magnetizing current curve, $i_m$, based on the equation:

$$i_m = i - \frac{U/2 - R_s i - 2L_\sigma \frac{di}{dt}}{R_r},$$

where $R_r$ represents a resistance of a rotor of the induction machine and $L_{r\sigma}$ represents a leakage inductance of the rotor of induction machine.

18. A method of manufacturing an induction machine control circuit comprising:

providing an induction machine;
coupling a DC-to-AC voltage inverter to the induction machine;
coupling a DC voltage bus to the DC-to-AC voltage inverter; and
configuring a controller to:
cause the DC-to-AC voltage inverter to apply a square-wave excitation to a pair of phases of the induction machine;
determine a stator resistance of a stator of the induction machine based on the square-wave excitation;
determine a rotor resistance of a rotor of the induction machine based on the square-wave excitation;
calculate a magnetizing curve for the induction machine based on the stator resistance and rotor resistance; and
control the induction machine to operate based on the magnetizing curve.

19. The method of claim 18 wherein configuring the controller to calculate the magnetizing curve comprises configuring the controller to calculate the magnetizing curve based on a relationship of a single phase magnetizing flux of the induction machine with a magnetizing current curve of the induction machine.

20. The method of claim 18 wherein configuring the controller further comprises configuring the controller to determine the magnetizing current curve based on the stator resistance and rotor resistance.

21. The method of claim 18 wherein coupling the DC-to-AC voltage inverter to the induction machine comprises:

coupling a first pair of switches to a first phase of the pair of phases of the induction machine; and
coupling a second pair of switches to a second phase of the pair of phases of the induction machine; and
wherein configuring the controller to cause the DC-to-AC voltage inverter to apply a square-wave excitation to the pair of phases of the induction machine comprises:
controlling a first switch of the first pair of switches to an on state;
controlling a second switch of the first pair of switches to an off state;
controlling a first switch of the second pair of switches to an on state; and
controlling a second switch of the second pair of switches to an off state.

* * * * *

UNITED STATES PATENT AND TRADEMARK OFFICE
CERTIFICATE OF CORRECTION

PATENT NO. : 8,988,035 B2  
APPLICATION NO. : 13/720668  
DATED : March 24, 2015  
INVENTOR(S) : Wang et al.

Page 1 of 1

It is certified that error appears in the above-identified patent and that said Letters Patent is hereby corrected as shown below:

In the Claims

Col. 10, line 47 (Claim 12), delete "$C_{L_m \psi\_real}$," and substitute therefore -- $C_{L_m - \psi_{m\_real}}$, --; and Col. 10, line 51 (Claim 12), delete "$C_{L_m \psi\_real}$." and substitute therefore -- $C_{L_m - \psi_{m\_real}}$. --.

Col. 11, line 6 (Claim 14), delete "$I(0) = -i_{rated}$," and substitute therefore -- $i(0) = -i_{rated}$, --.

Col. 11, line 15 (Claim 15), delete "$\psi_{m\_real} = \psi_{m\_offset}$," and substitute therefore -- $\psi_{m\_real} = \psi_m - \psi_{m\_offset}$, --.

Signed and Sealed this  
Twenty-ninth Day of September, 2015

Michelle K. Lee  
*Director of the United States Patent and Trademark Office*